(12) United States Patent
Sheng et al.

(10) Patent No.: US 7,023,368 B1
(45) Date of Patent: Apr. 4, 2006

(54) DIGITAL-TO-ANALOG SIGNAL CONVERTING APPARATUS AND METHOD TO EXTEND USABLE SPECTRUM OVER NYQUIST FREQUENCY

(75) Inventors: Neng-Haung Sheng, Thousand Oaks, CA (US); Cheh-Ming Jeff Liu, Thousand Oaks, CA (US)

(73) Assignee: Euvis, Inc., Westlake Village, CA (US)

( * ) Notice: Subject to any disclaimer, the term of this patent is extended or adjusted under 35 U.S.C. 154(b) by 0 days.

(21) Appl. No.: 10/931,874

(22) Filed: Aug. 31, 2004

(51) Int. Cl.
*H03M 1/00* (2006.01)
*H03B 21/00* (2006.01)
*G06F 1/02* (2006.01)

(52) U.S. Cl. .................. 341/141; 327/105; 708/271
(58) Field of Classification Search .......... 341/141, 341/144; 327/107, 105; 331/18, 14, 16, 331/1 R; 708/3, 271, 276
See application file for complete search history.

(56) References Cited

U.S. PATENT DOCUMENTS

| | | | | |
|---|---|---|---|---|
| 4,951,237 A | * | 8/1990 | Essenwanger | 708/276 |
| 5,028,887 A | * | 7/1991 | Gilmore | 331/18 |
| 5,073,869 A | * | 12/1991 | Bjerede | 708/271 |
| 5,291,428 A | * | 3/1994 | Twitchell et al. | 708/3 |
| 5,331,293 A | * | 7/1994 | Shepherd et al. | 331/1 R |
| 5,563,535 A | * | 10/1996 | Corry et al. | 327/105 |
| 5,931,891 A | * | 8/1999 | Landry | 708/271 |
| 5,999,060 A | * | 12/1999 | Zuta | 331/14 |
| 6,060,917 A | * | 5/2000 | Saul | 327/107 |
| 6,188,288 B1 | * | 2/2001 | Ragan et al. | 331/16 |
| 6,417,793 B1 | * | 7/2002 | Bugeja et al. | 341/144 |
| 6,483,388 B1 | * | 11/2002 | Khan | 331/18 |
| 6,812,878 B1 | * | 11/2004 | Jewett et al. | 341/144 |
| 6,825,785 B1 | * | 11/2004 | Huang et al. | 341/141 |

\* cited by examiner

*Primary Examiner*—Patrick Wamsley
(74) *Attorney, Agent, or Firm*—Michael Blaine Brooks, P.C.; Michael B. Brooks

(57) ABSTRACT

A digital-circuit return-to-zero device and method for digital-to-analog conversion is disclosed that uses an internal multiplexer alternatively selecting, or selecting in a scheduled fashion, digital input data and an expansion code. By the using the disclosed multiplexing process, where the expansion code is a null code, the usable analog spectrum of the digital-to-analog converter (DAC) extends beyond that of DACs. With the multiplexing process applied to a complementary interpolation process, the disclosed device is adapted for selective enhancement of the frequency spectrum proximate to the clock frequency. While extending the usable frequency spectrum beyond conventional DACs, the present invention, in its several embodiments, features low complexity and high portability relative to known response expansion solutions.

28 Claims, 19 Drawing Sheets

DIGITAL-TO-ANALOG SIGNAL CONVERTING APPARATUS AND METHOD TO EXTEND USABLE SPECTRUM OVER NYQUIST FREQUENCY

BACKGROUND

1. Field of the Invention

The present invention relates to the conversion of signals from digital to analog form and more particularly relates to high-speed wideband data conversion via digital-to-analog converters for and methods of generating analog signals having usable spectra extended beyond the Nyquist frequency.

2. Description of the State of the Art

Conventional digital-analog converters translate digital signals to analog signals by holding, for each converter clock cycle, the values of the digital signals at each converter clock cycle. The corresponding spectrum is represented as being within an envelope in a response of sinc ($\pi f/f_{ck}$) which has null points at multiples of the clock frequency, e.g., 1 $f_{ck}$, 2 $f_{ck}$, 3 $f_{ck}$, and so on. Due to the uneven response, the usable frequency range is limited from DC, or steady-state, to half of the clock frequency where half the clock frequency, when acting as a sampling frequency, is known as and termed the Nyquist frequency. The usable frequency band is known as and termed the Nyquist bandwidth.

As illustrated in FIG. 1, in a digital signal processing subsystem 10, where a multi-rate digital expander 12, which is an extra digital signal-processing module, can be used to extend the usable frequency range, that is the range that is useful linear signal processing for example. The expander 12 inserts M-1 zero points in the original digital signal 11, x(n), preceding the conventional DAC at a multiple, m, of the original clock rate. The output digital signal 13, xE(m), of the expander is fed to a conventional digital-to-analog converter (DAC) 14 which generates an analog waveform 15, x(t). Due to the higher data rate and relative narrower pulse shape, the prior art approach can extend the usable analog output spectrum by a factor of m as compared to a conventional digital-to-analog converting process. Extra interpolation filters can be added following the expander 12 to further select a specific bandwidth within the extended usable spectrum. However, in order to implement this approach, the digital subsystem 10 requires two different clock rates and the extra expander 12. This expander-DAC subsystem 10 complicates the digital code implementation and introduces a need of a higher clock rate resulting in a higher cost of the entire digital signal processing subsystem 10 and the overall digital signal processing in which it is integrated.

FIG. 2 illustrates an alternative subsystem 20 that shapes in the frequency domain the signal at the analog output 27, X(t), of the DAC 14. FIG. 2 also shows the conventional DAC 14 followed by an analog track-and-reset shaping component 23. The track-and-reset shaping component 23 is used as a means for spectrum envelope shaping. In each clock cycle, the track-and-reset component 23 tracks the analog signal of the DAC 14, i.e., the analog output 27, X(t), in a fraction of a clock period and resets 24 the output 26, Xs(T), to zero 25 for the remainder of the clock period. Typically, the timing ratio of the track cycle and the reset cycle is 1:1. The track-and-reset component 23 follows the conventional digital-to-analog converter 14, performs shaping on the analog output signal 27, X(t), of the digital-to-analog converter 14, and, because of the narrower shape of the analog signal 26, Xs(t), results in a flatter envelope response compared to the conventional digital-to-analog converters. This track-and-reset component can also eliminate the transient distortion if timing is appropriately selected. However, the overall linearity of the processing done by the subsystem 20 can deteriorate due to the inherent non-linearity of the track-and-reset component 23. In particular, it is at high clock rates that the linearity of the processing can be worsened by the limit of dynamic performance of the analog track-and-reset component 23. Furthermore, in the reset cycle, feed-through between the digital-to-analog converter 14 and the output signal 26, Xs(t), can further degrade the overall performance.

With the increased cost of implementing pre-DAC processing such as digital expanders 12 and the performance limitations and degradations of track-and-reset components 23 in post-DAC processing, there remains a need for a digital domain device and method, producing a spectral extension of the usable analog spectrum, to improve digital-to-analog conversion.

SUMMARY OF THE INVENTION

The present invention in its several embodiments includes a circuit implementation for a digital-to-analog converter that uses an internal multiplexer to extend the usable spectrum of the analog output. The spectrum extension is performed in the digital domain and implemented by a multiplexing module. By multiplexing, i.e., alternatively selecting or selecting in a scheduled fashion, between the digital input signal and an internal expansion module outputting an internal expansion code, for example a null code, the spectrum of the analog output can be made more uniform over a wide range of frequencies. Accordingly, neither a higher clock rate nor a following analog track-and-reset component is required for the original embedded system and thus the present invention enhances the resulting subsystem's portability to ultra-wideband applications.

Because a digital circuit-based return-to-zero process, i.e., the insertion of the null code, of an embodiment of the present invention is performed within the converter prior to outputting to current switches and thereby effecting analog conversion, there is no need to modify the upstream digital codes of the digital processes for analog spectrum expansion as in the digital expander approach.

Furthermore, the present invention achieves the analog spectrum expansion without requiring additional components following the analog output and thereby preserves the linearity of the output signal. The internal expansion module is contained within the preferred converter embodiments of the present invention and with the self-insertion null code of the first preferred embodiment of the present invention, the converter of this embodiment may be directly applied to replace a conventional digital-to-analog converter.

According to the example embodiments of the present invention, the digital-to-analog converters employing the digital-circuit return-to-zero implementations extend the usable frequency beyond that of the conventional digital-to-analog converter. In comparing the present invention, in its several embodiments, with previous devices, subsystems and methods, the digital-to-analog converters of the present invention do not require a modification of the digital input data or input codes and do not require an extra following track-and-reset component in order to achieve the usable frequency extension as disclosed herein. In addition to eliminating the need for a higher clock rate and an expander module external to the DAC, the teaching of the present invention also preserves the linearity by obviating the need for an extra track-and-reset component. The present invention makes it practical to use the same digital codes and front-end hardware circuitry as a conventional digital-to-analog converter and thereby reduces the complexity and power consumption of an entire system availing itself of the herein described digital-to-analog converting embodiments of the present invention.

Furthermore, an alternate embodiment has the usable spectrum selectively switched and extended beyond the clock frequency by multiplexing, within the DAC, between the digital code and an internal extension code module output that outputs, with this next preferred embodiment, the complementary code of the digital input signal. That is, rather than inserting the null code as the expansion code of the internal expansion code module, the multiplexer alternatively selects the digital input codes and their complementary codes. This complementary interpolation process of the alternative embodiment acts as a high-pass filter and enhances the power of the spectrum over the Nyquist frequency, i.e., half clock frequency. Similarly, by the complementary interpolation of the present invention, the digital-to-analog converter may be used in an existing system by replacing a conventional digital-to-analog converter directly without introducing or otherwise requiring high clock frequencies, high data rates or an extra following track-and-reset component.

BRIEF DESCRIPTION OF THE DRAWINGS

For a more complete understanding of the present invention and for further features and advantages, reference is now made to the following description taken in conjunction with the accompanying drawings, in which.

DETAILED DESCRIPTION OF THE PREFERRED EMBODIMENT

Figure 1:
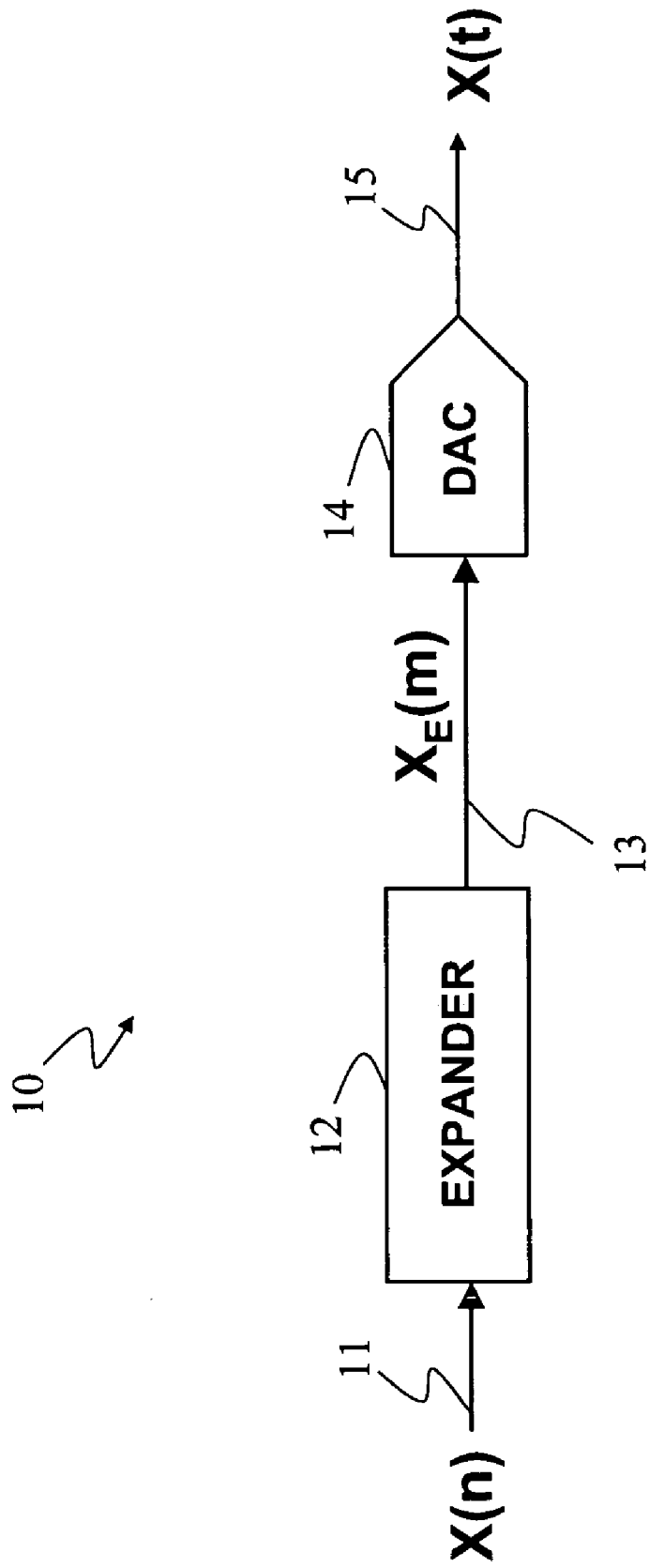
FIG. 1 illustrates a multi-rate system with an expander and a conventional digital-to-analog converter for extending the usable spectrum.
Figure 2:
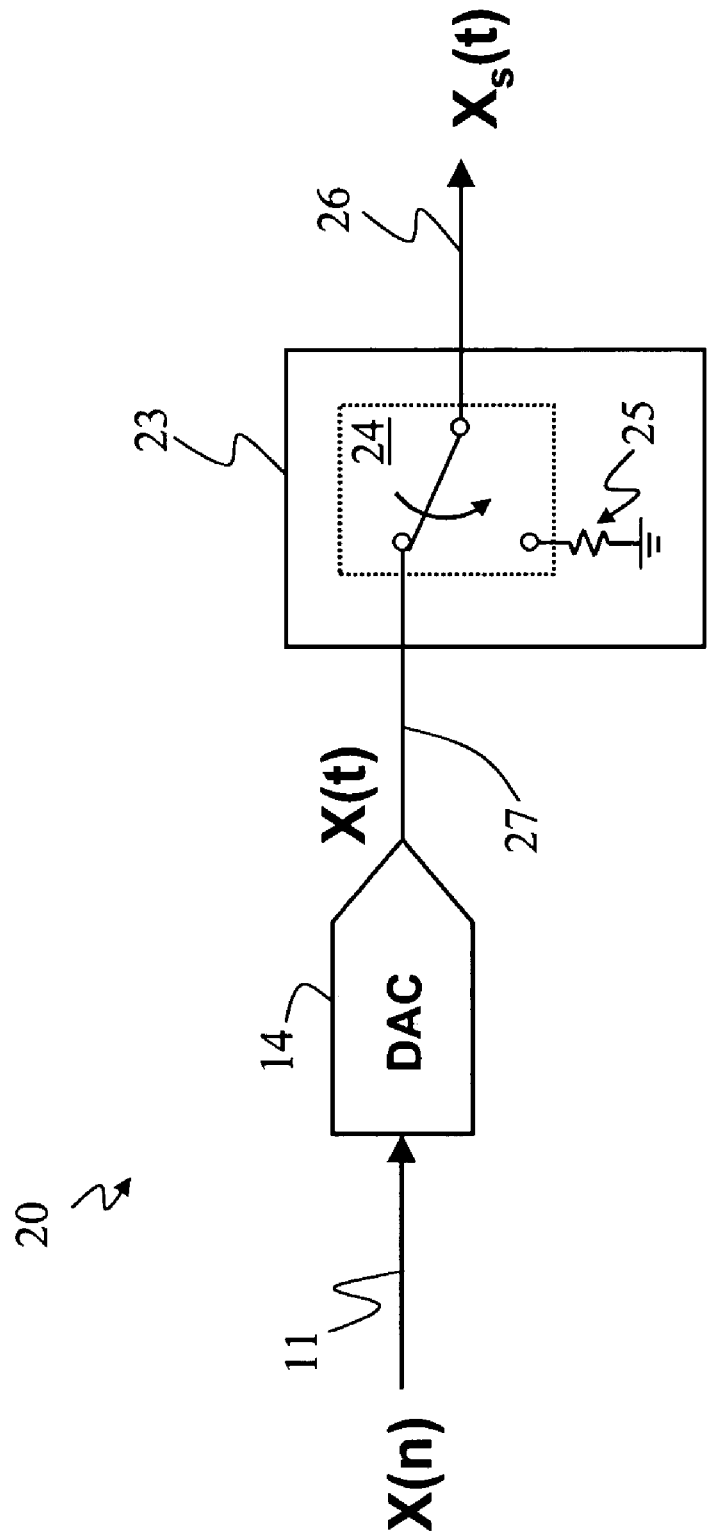
FIG. 2 illustrates a conventional digital-analog converter with a track-and-reset component at the analog output for extending the usable spectrum.
Figure 3:
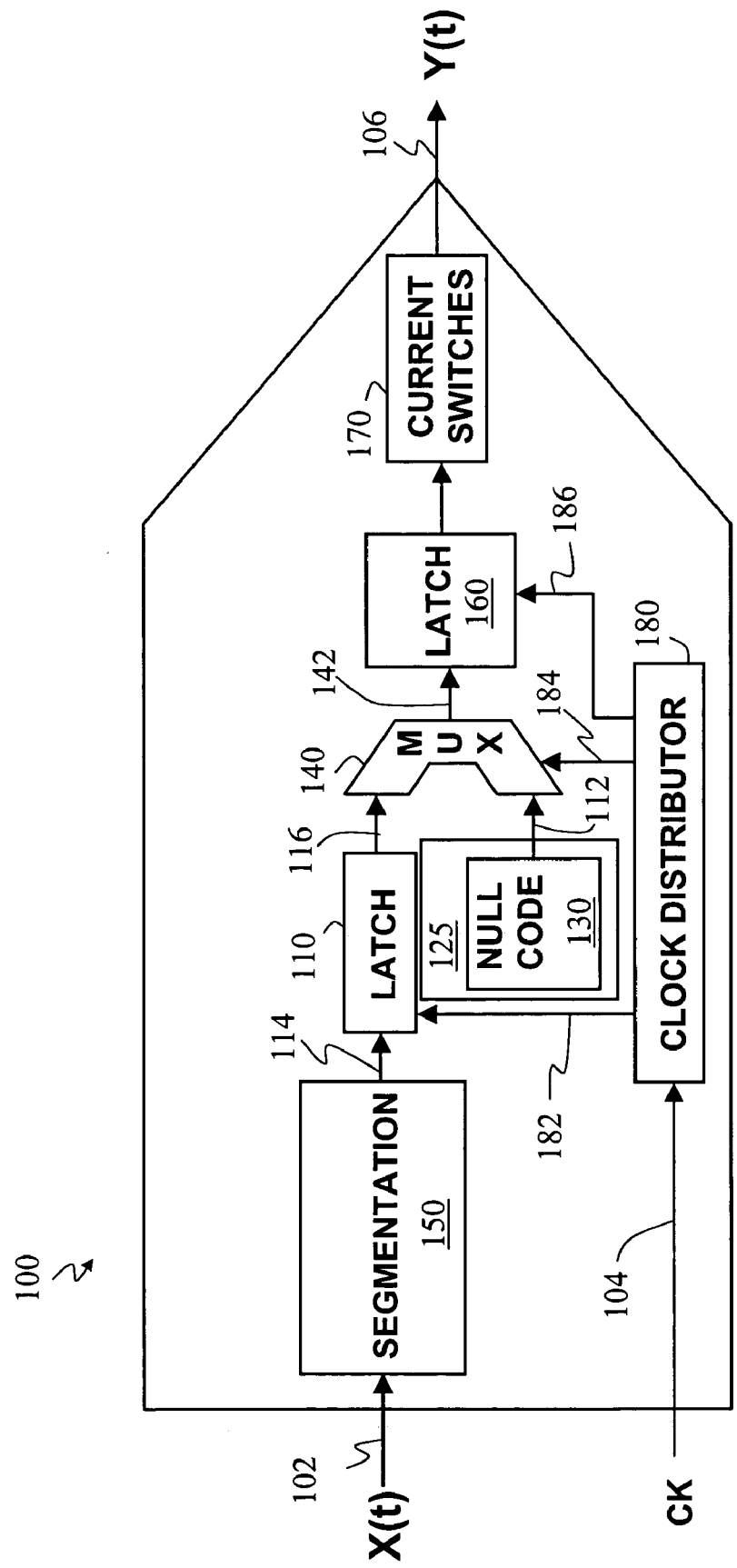
FIG. 3 is a functional block diagram representing the preferred embodiment of the present digital-to-circuit return-to-zero digital-analog converter invention.

Illustrated in FIG. 3 is a functional diagram of a digital-to-analog converter 100 representing by example the first preferred embodiment of the present invention. The converter 100 includes a first latch module 110, a second latch module 160, an internal expansion code generator or internal expansion module 125 including a null code generator 130, a multiplexer (MUX) 140, a segmentation module 150, a current switch array 170, and a clock distributor or clock signal distribution module 180. The N-bit digital input data x(n) 102 is sampled at the input of the segmentation module 150. In the multiplexing process of the present invention, preferably the clock signal distribution module 180 generates the required clock cycles 201 as seen in FIG. 2, and therefore the state timing, for the first latch 110, the second latch 160 and the multiplexer 140.

The segmentation module 150 divides the digital input data x(n) 102 into binary weighted codes and thermometer codes to minimize the glitch energy, reduce thermal dependency, and improve the linearity. Thermometer code encoding follows a rule where the point where the code changes from ones to zeros is the point where the input signal becomes smaller than the respective comparator reference levels. The segmented codes 114 are latched by the first latch module 110.

Generally, the internal expansion module 125 generates an internal expansion code that may be dependent or independent of the data input signal. The first preferred embodiment has a null code generator 130 as part of the internal expansion module 125 generating a constant null code 112 as the internal expansion code. The null signal or null code 112 and the latched segmented signals or codes 116 are selected alternatively, or in a scheduled sequence, by the multiplexer module 140. The second latch module 160 latches the multiplexer output 142 to ensure a stable output between two transitions. The current switches module 170 generates the corresponding weighted currents to the output resistor load forming an analog output waveform 106. The clock signal distribution module 180 receives a clock signal 104 and generates and distributes clocks, or timing signals, with proper phases. That is, the clock signal distribution module 180 generates a first latch module clock 182 for the first latch module 110, a second latch module clock 186 for the second latch module 160 and a multiplexer module clock 184 for the multiplexer module 140.

Figure 4:
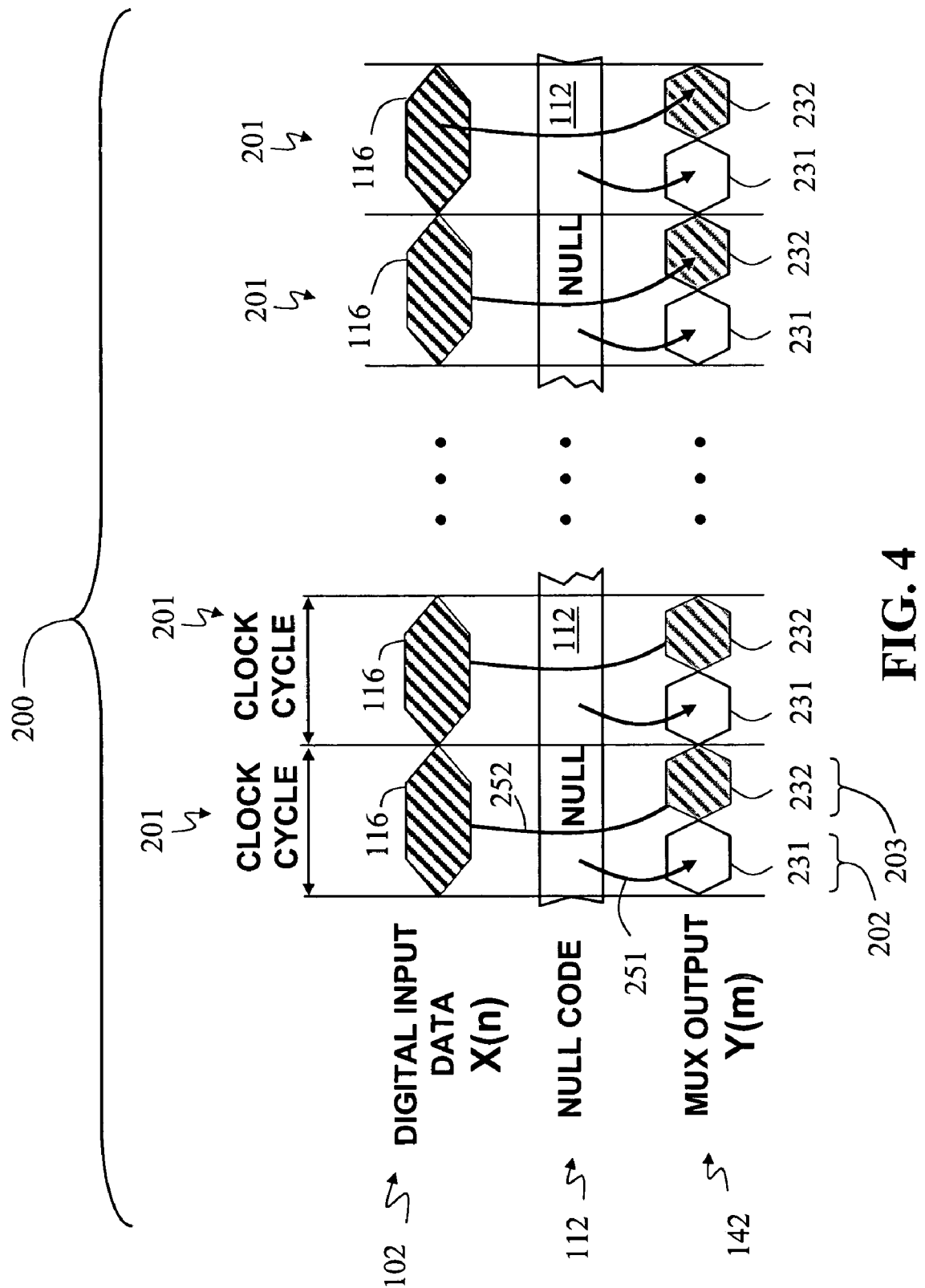
FIG. 4 illustrates a timing latency diagram of the present invention.

FIG. 4 is a timing diagram 200 showing a representative clock latency of an example embodiment of the present invention. In each clock cycle 201, the digital input data 102, x(n), and the constant null code 112 are selected alternatively, for this example, for the multiplexer output 142. Also for this example, it is during the first half of a clock cycle 202 that the null code 112 is selected 251 for the multiplexer output 142. For this example, it is during the second half of a clock cycle 203 that the digital input data code 116 is selected 252 for the multiplexer output 142. Sequentially, or by way of interleaving, and for each successive clock cycle 201, the selected null code 231 and the selected digital input data 232 comprise the multiplexer output 142. The order of selection or interleaving may be reversed in alternative embodiments. Accordingly, where m and n are integers: (a) when m is an odd number, the multiplexer output y(m) is assigned as y(m)="null code" and (b) when m=2n, i.e., when m is an even number, the multiplexer output y(m) 142 is assigned as y(m)=x(n). The multiplexing process continues in this alternating manner thus completing the digital-domain return-to-zero for the digital input data x(n) 102.

Figure 5A:
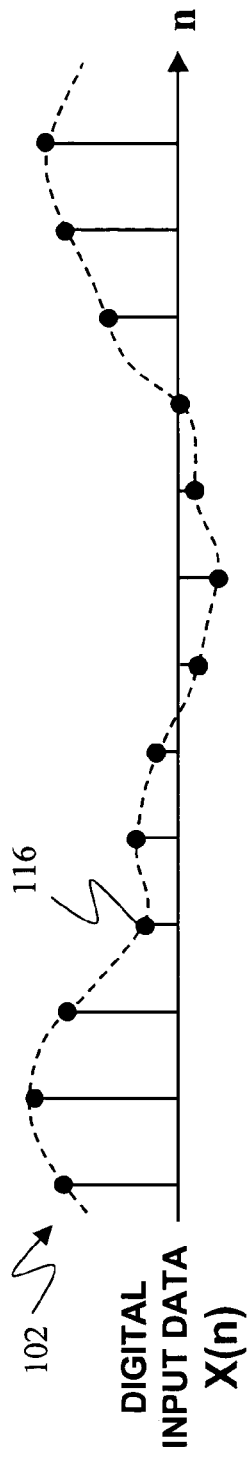
FIGS. 5A, 5B and 5C collectively illustrate example signals of an example multiplexing process with a timing ratio of 1:1.
Figure 5B:
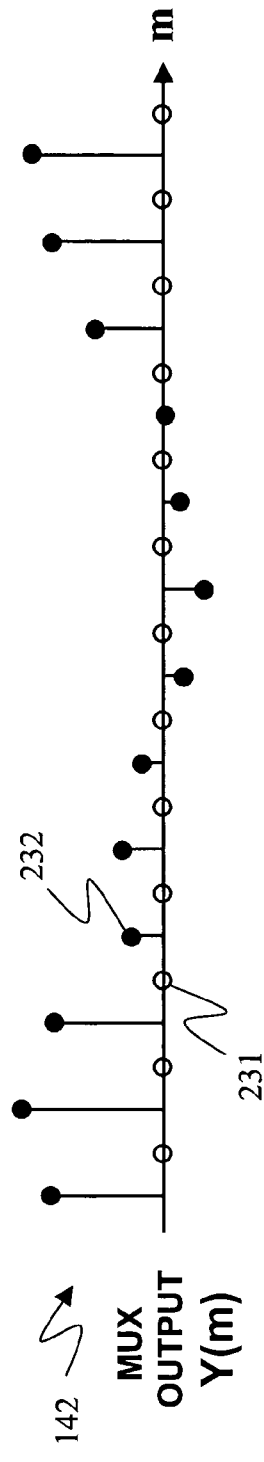
Figure 5C:
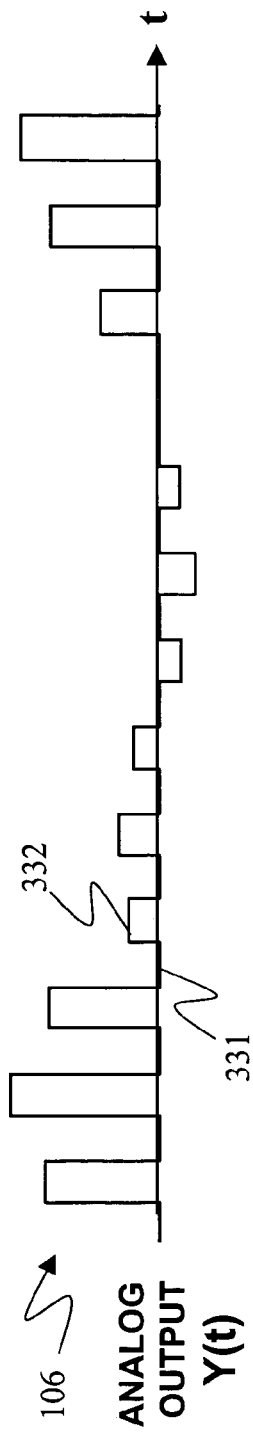

FIG. 5A illustrates, in the discrete time-domain, for an example embodiment of the present invention, signals of the digital input data 102, x(n), particularly the latched digital input signals 116 to be provided to the MUX 140 every clock cycle of n clock cycles. FIG. 5B illustrates, in the discrete time domain, the multiplexer output 142, y(m), where m=2n for this example timing ratio, comprising the selected null code 231 and the selected digital input data 232. FIG. 5C illustrates, in the continuous time-domain, the analog output 106, y(t), having zero values 331 and nonzero values 332.

Figure 6:
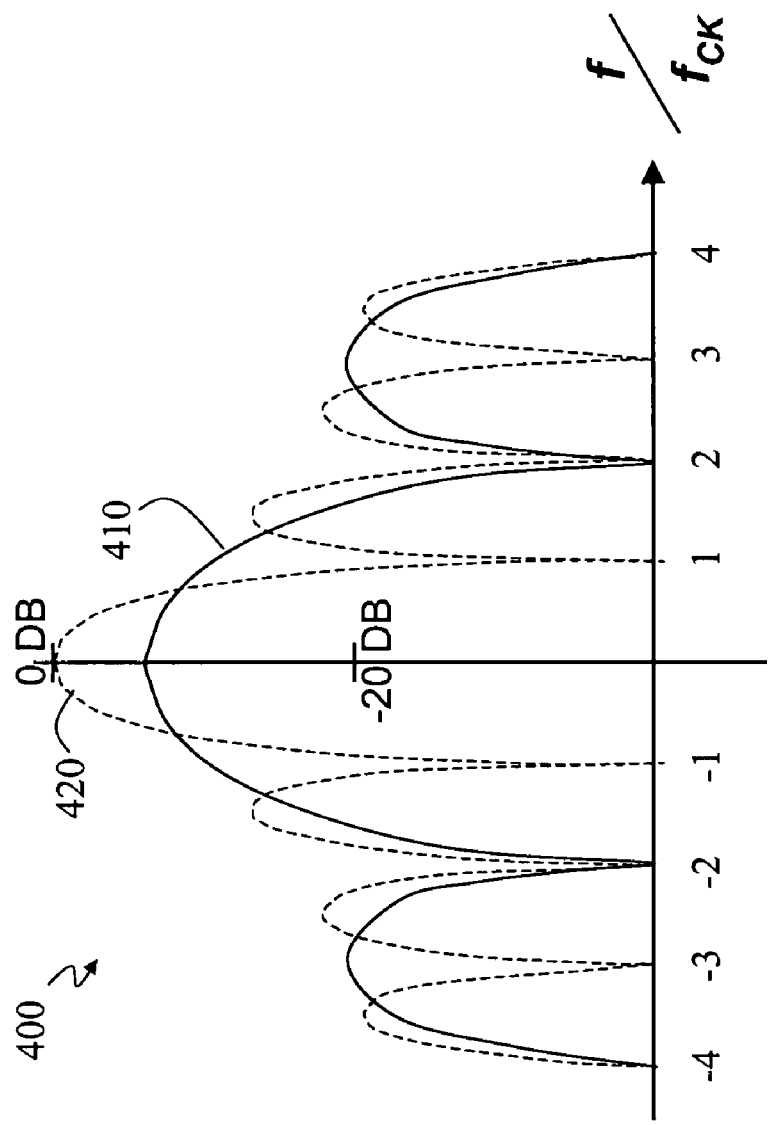
FIG. 6 illustrates the spectral envelope of an embodiment of the present invention and the spectral envelope of a conventional DAC.

FIG. 6 illustrates the spectral envelopes 400 of an example embodiment of the present invention and a conventional digital-to-analog converter. The spectral envelope of an example embodiment of the digital-domain return-to-zero digital-to-analog converter invention, 410, is $$0.5*\text{sinc}\,(\pi f/(2f_{ck})) \quad [1]$$

where f is the frequency variable and $f_{ck}$ is the clock frequency of the example digital-to-analog converter embodiment. The first null point of the envelope 410 is at twice of the clock frequency $f_{ck}$ and is at twice the first null point of conventional non-return-to-zero digital-to-analog converter 420.

Analog Output Spectrum Extended by Timing Ratio Adjustments

Figure 7:
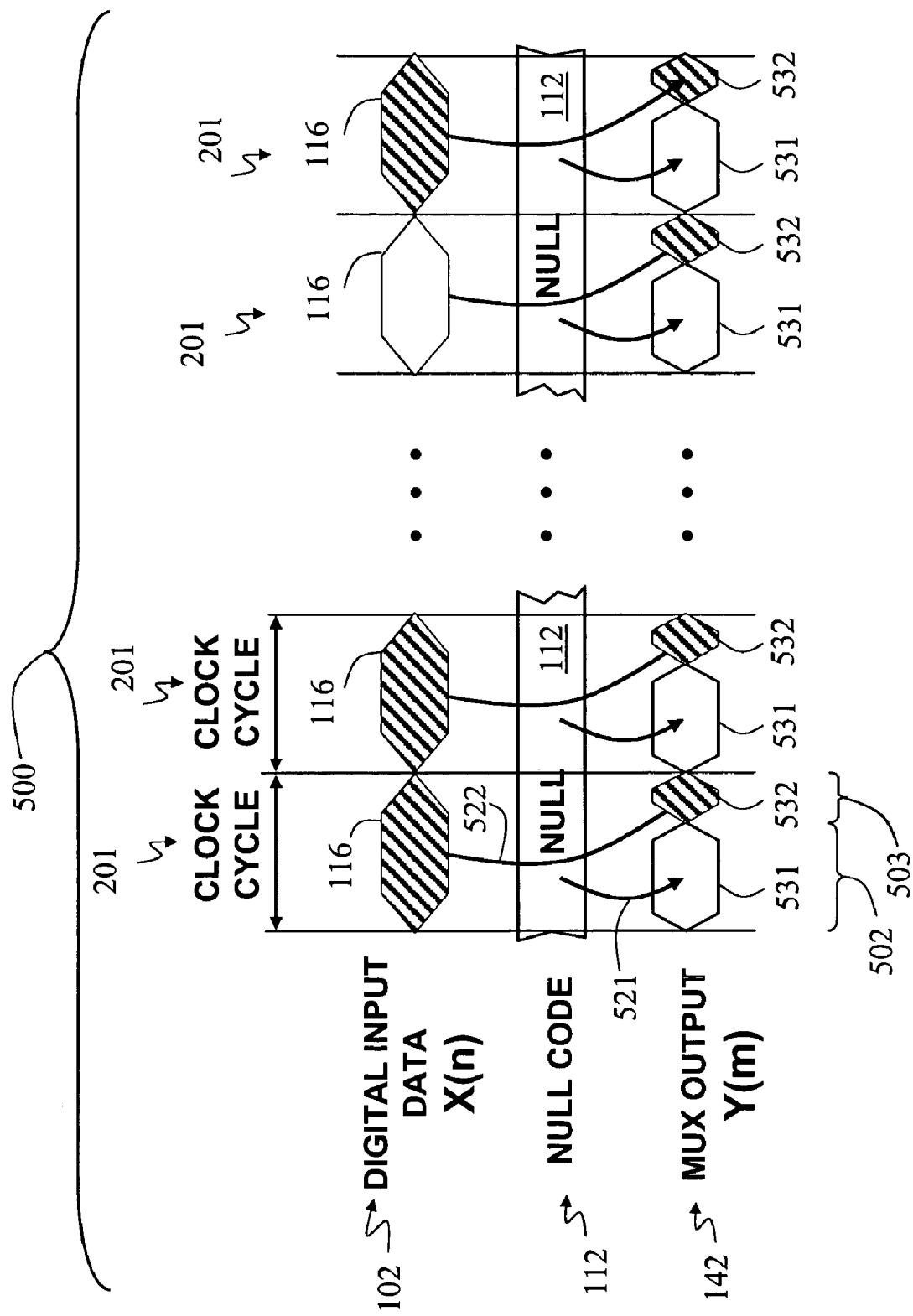
FIG. 7 illustrates a timing latency diagram of a timing ratio of 1:3 of an example multiplexing process of the present invention.

The envelope of the analog output spectrum can be modified by adjusting the timing ratio of multiplexing between the digital input data 102, x(n), particularly the latched digital input data 116, and the null code 112. FIG. 7 shows a 1:3 multiplexing process 500. In this example, it is during the proceeding three quarters of clock cycle 502 that the null code 112 is selected 521 for the multiplexer output 142. In this example, it is during the last quarter of clock cycle 503 that the digital input data code 116 is selected 522 for the multiplexer output 142. Sequentially, or by way of interleaving, and for each successive clock cycle 201, the selected null code 531 and the selected digital input data 532 comprise, in a timing ratio of 3:1 respectively, the multiplexer output 142. The order of selection or interleaving may be reversed in alternative embodiments. Accordingly, were m and n are integers: (a) when m does not equal 4n, the multiplexer output y(m) is assigned as y(m)="null code" and (b) when m=4n, i.e., when m is four times the value of n, the multiplexer output y(m) 142 is assigned as y(m)=x(n). In this example, the multiplexing process continues in this three-to-one manner and thereby completing the digital-domain return-to-zero for the digital input data 102, x(n). As with the previously disclosed multiplexing process, the required clock cycles and state timing for the first latch 110, the second latch 160 and the multiplexer 140 are generated by the clock signal distribution module 180 (FIG. 3).

Figure 8A:
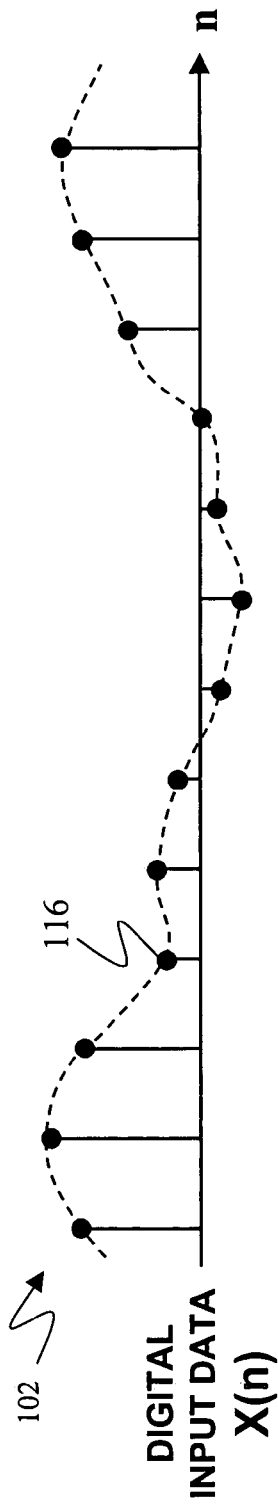
FIGS. 8A, 8B and 8C collectively illustrate example signals of multiplexing process with a timing ratio of 1:3.
Figure 8B:
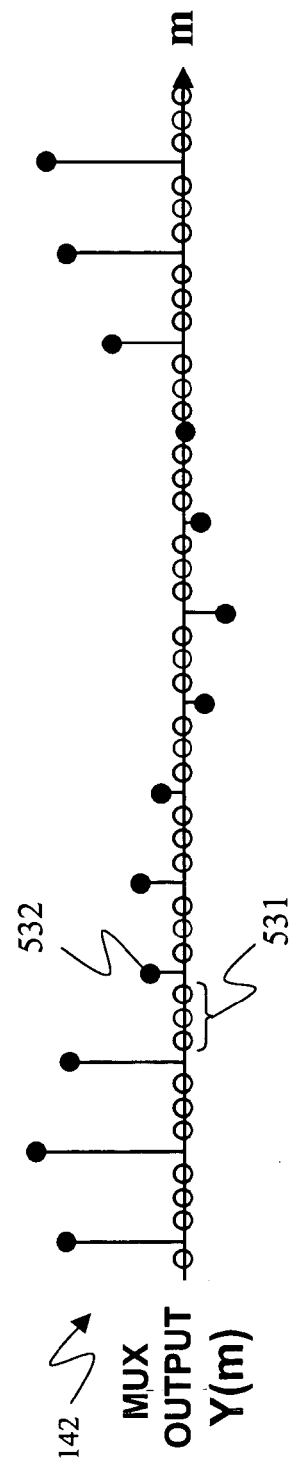
Figure 8C:
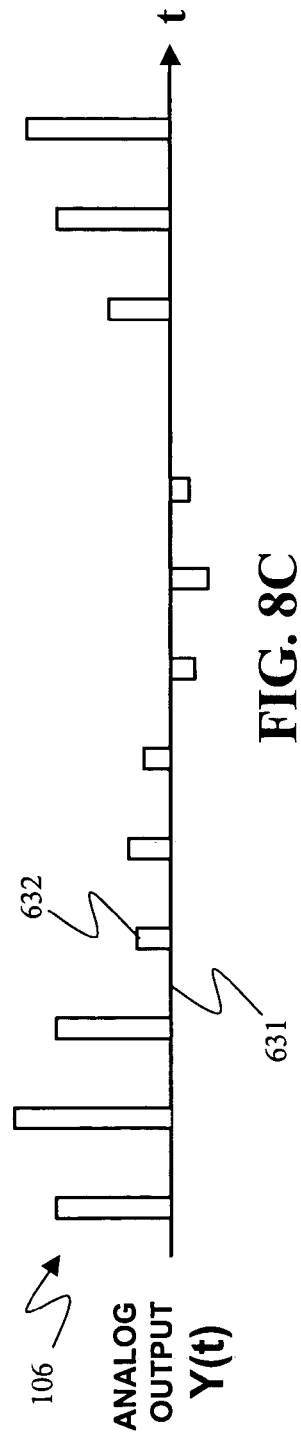

FIG. 8A illustrates, in the discrete time domain, for an example embodiment of the present invention, signals of the digital input data 102, x(n), particularly the latched digital input signals 116 to be provided to the MUX 140 every clock cycle of n clock cycles. FIG. 8B illustrates, in the discrete time domain, the multiplexer output y(m) 142, where m=4n for this example timing ratio, comprising the selected null code 531 and the selected digital input data 532. FIG. 8C illustrates, in the continuous time-domain, the analog output y(t) 106 having zero values 631 and nonzero values 632.

Figure 9:
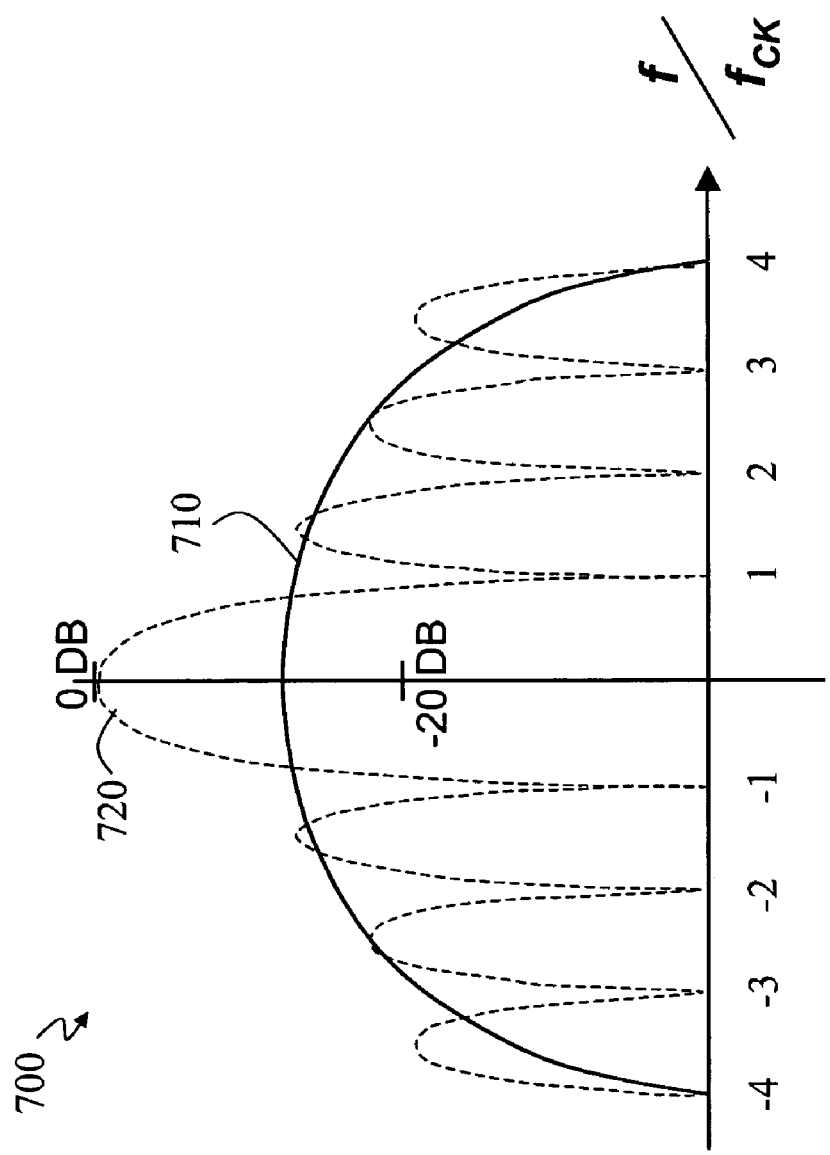
FIG. 9 illustrates the spectral envelope of an embodiment of the present invention with a 1:3 timing ratio and the spectral envelope of a conventional DAC.

FIG. 9 illustrates the spectral envelopes 700 of the example digital-to-analog converter of the present invention with a 3:1 multiplexing timing ratio and a conventional digital-to-analog converter. The envelope of the digital-domain return-to-zero digital-to-analog converter, 710, is $$0.25*\text{sinc}(\pi f/(4f_{ck})), \quad [2]$$

where f is the frequency variable and $f_{ck}$ is the clock frequency of the digital-to-analog converter. The first null point of the spectral envelope 710 of the example embodiment of the present invention is at quadruple the clock frequency $f_{ck}$ and extends quadruple the distance in frequency as compared to the envelope of conventional non-return-to-zero digital-to-analog converter 720. For other embodiments, the usable frequencies are further extended via the above-disclosed method and apparatus where multiplexing ratios higher than four are used, and thereby yielding lower, flatter power spectra.

Figure 10:
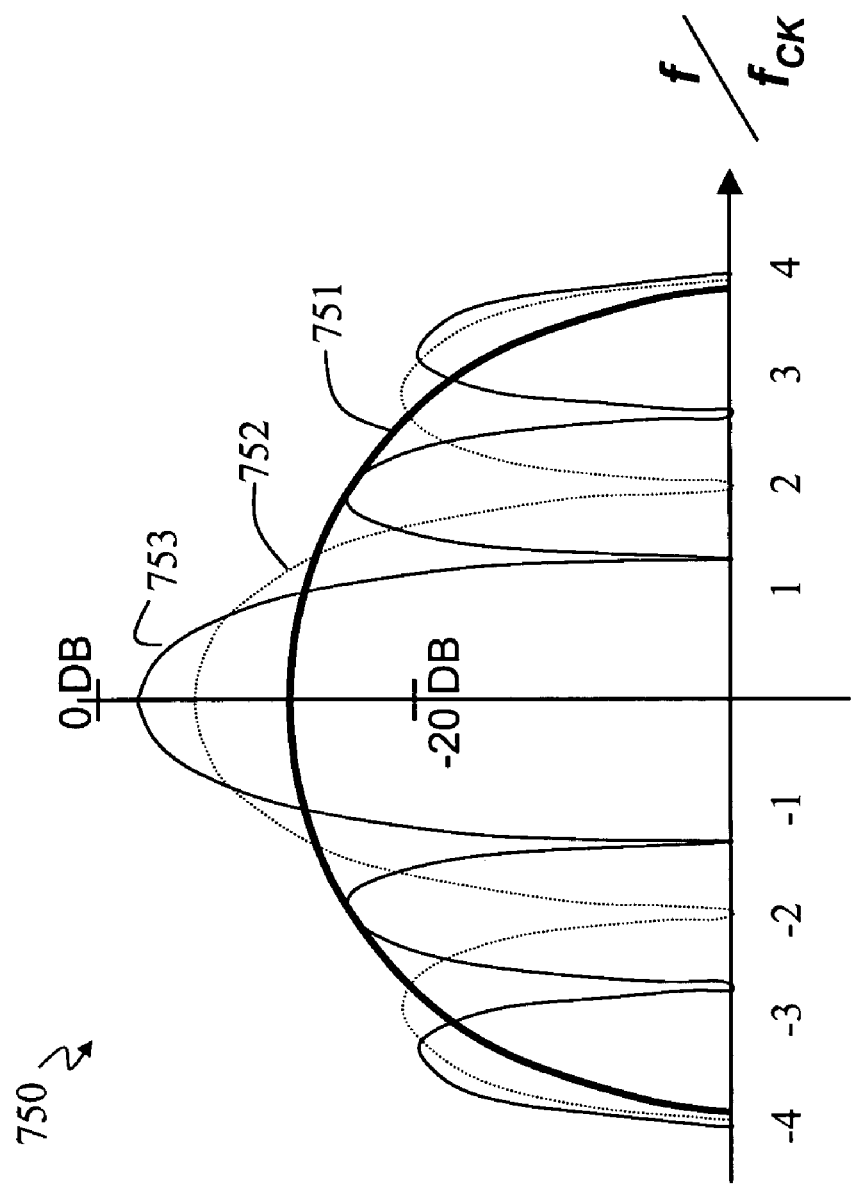
FIG. 10 shows spectral envelopes resulting from the use of three different timing ratios of the present invention.

The power and the flatness of a spectral envelope may be determined by the multiplexing timing ratio. A higher timing ratio results in a flatter spectrum and lower power relative to lower timing ratios. On the other hand, a lower timing ratio results in a narrower spectrum with a higher power envelope. FIG. 10 shows a comparison of spectral envelopes 750 of three timing ratios, a ratio higher than equal of 3:1 751, an equal ratio of 1:1 752, and a ratio lower than equal of 1:3 753. Furthermore, an alternate embodiment includes an adjustable timing ratio implementation allowing for an optimization of performance relative to the power height and envelope and spectral bandwidth.

Figure 11:
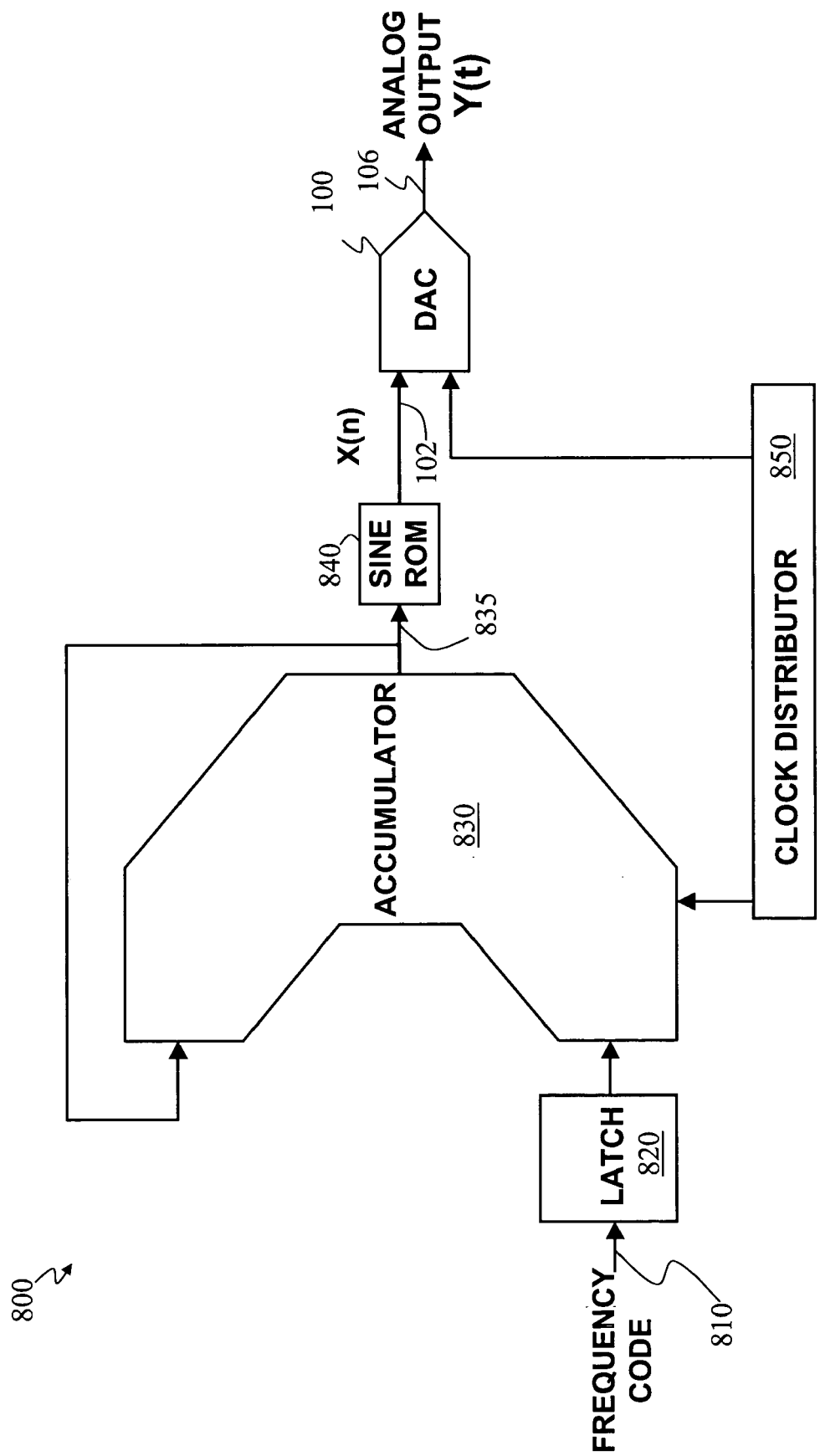
FIG. 11 shows a functional diagram of a direct-to-digital-frequency synthesizer with a digital-to-analog converter of the instant invention.

FIG. 11 shows a direct-digital-frequency synthesizer 800 comprising a frequency code input 810 followed by a latch 820, an accumulator 830, a waveform determiner 840, a clock distributor or a clock signal distribution unit 850, and a digital-circuit return-to-zero digital-to-analog converter 100. The frequency code 810 is latched by the latch unit 820 and accumulated in the accumulator 830. A determination of the waveform for the digital input data x(n) 102 is next made and an example of this is illustrated with the accumulated digital word 835 being passed to a waveform determiner 840 which in this example is a sine wave look-up table, with lookup amplitude for the values preferably contained in a read-only memory(ROM), and where the appropriate amplitude for the waveform is determined via a lookup. The determined digital waveform is fed to a digital-circuit return-to-zero digital-to-analog converter 100 as described above by example as preferred and alternate embodiments of the present invention. Thereafter, the digital-domain return-to-zero method and apparatus 100 extends the usable spectrum of the direct-digital-frequency synthesizer beyond the Nyquist frequency, that is, beyond half of system clock or sampling frequency.

DETAILED DESCRIPTION OF AN ALTERNATIVE EMBODIMENT

Figure 12:
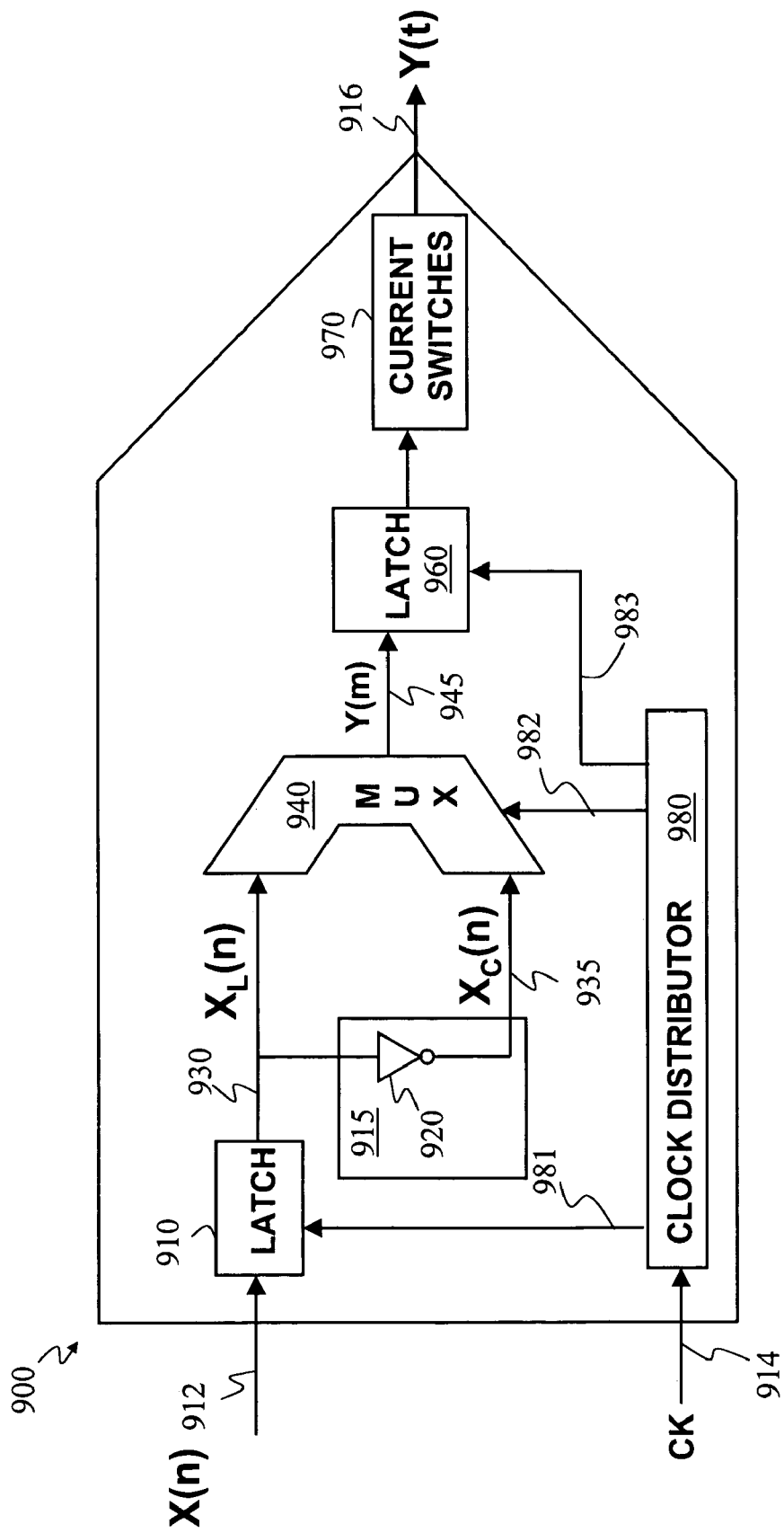
FIG. 12 is a functional block diagram representing the alternative embodiment of the present digital-circuit complementary interpolation digital-to-analog converter invention.

FIG. 12 shows a digital-to-analog converter 900 comprising a first latch module 910, an internal expansion code generator or an internal expansion module 915 having an inverting module 920, a multiplexer 940, a second latch module 960, a current switch module 970 and a clock distributor or clock signal distribution module 980. The digital input data 912, x(n), is latched by the first latch module 910. Generally, the internal expansion module 915 outputs internal expansion code where in this embodiment, the internal expansion module includes an inverting module 920 that inverts the latched digital input data 930, $x_L(N)$, into its complementary codes 935, $x_C(n)$. In each clock cycle, the multiplexer 940 alternatively, or in a scheduled fashion, selects the latched digital input data 930, $x_L(n)$, and the corresponding complementary codes 935, $x_C(n)$. This hardware multiplexing process between input code 930, $x_L(n)$, and its complementary code 935, $x_C(n)$, results in a complementary interpolation, which functions as a high-pass filter and extends the frequency range of the usable spectrum beyond that of a conventional digital-to-analog converters. The order of selection may be reversed in alternative embodiments. The clock distribution module 980 receives a clock signal 914 and generates and distributes clocks, or timing signals, with proper phases. That is, the clock distribution module 980 generates a first latch module clock 981 for the first latch module 910, a second latch module clock 983 for the second latch module 960 and a multiplexer module clock 982 for the multiplexer module 940.

Figure 13:
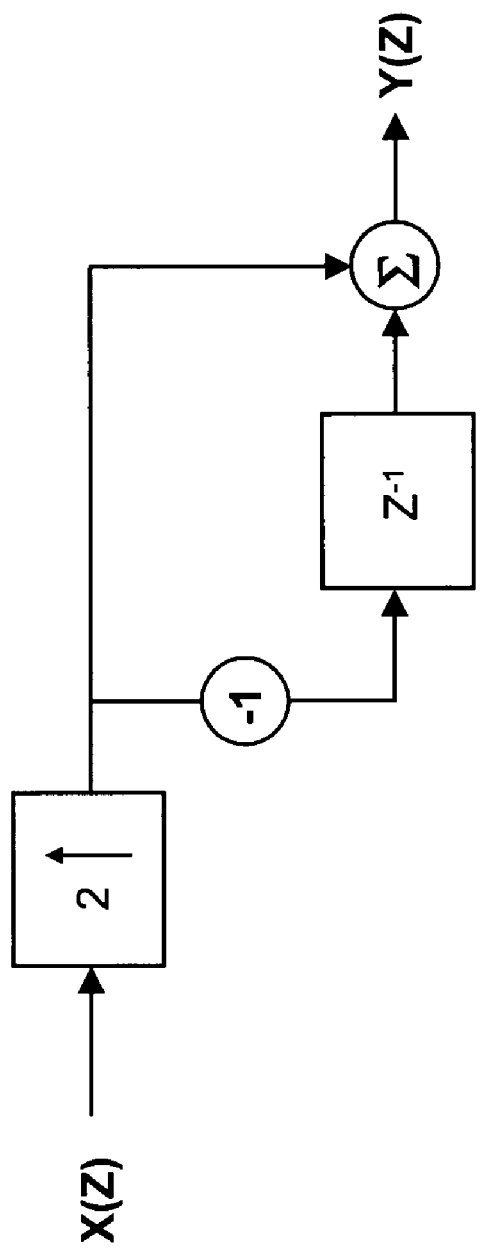
FIG. 13 shows an equivalent z-domain block diagram for the present digital circuit complementary interpolation process.

FIG. 13 shows an equivalent functional block diagram for the complementary interpolation process with equal duty cycles in multiplexing. The transfer function of the high-pass interpolation filter is derived as $$Y(z)=X(z^2)\cdot(1-z^{-1}),\qquad [3]$$

where x and Y are z-transforms of the input data 930, $x_L(n)$, and the output of multiplexer 945, y(m), respectively and $z^{-1}$ represents half clock cycle delay.

Figure 14A:
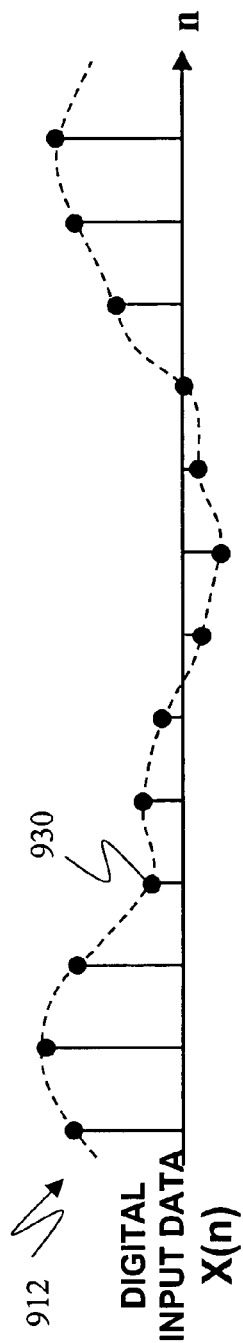
FIGS. 14A, 14B and 14C collectively illustrate example signals of an example complementary interpolation process with a timing ratio of 1:1.
Figure 14B:
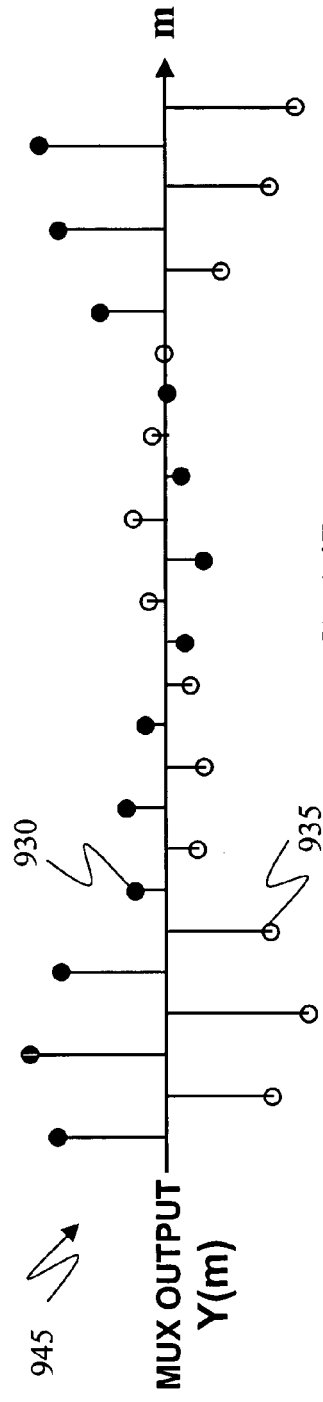
Figure 14C:
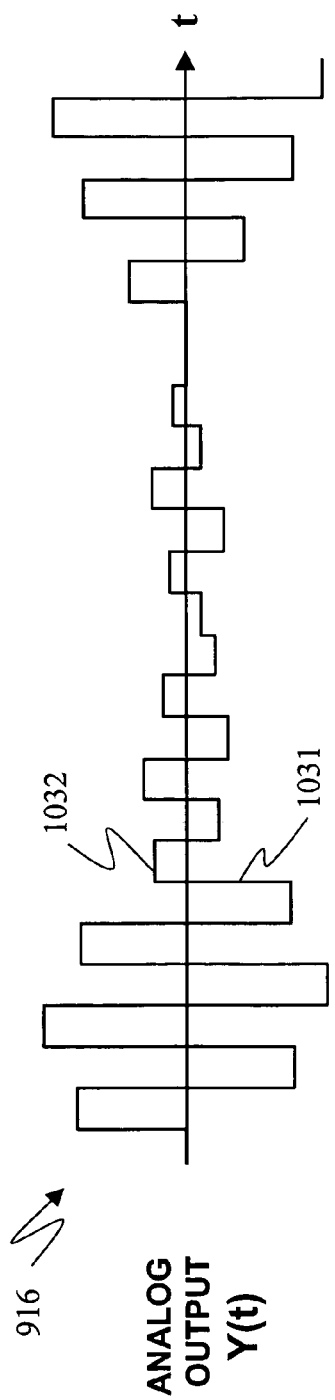

FIG. 14A illustrates, in the discrete time domain, for an example complementary code embodiment of the present invention, signals of the digital input data 912, x(n), particularly the latched digital input signals 930 to be provided to the MUX 940 every clock cycle of n clock cycles. FIG. 14B illustrates, in the discrete time-domain, the multiplexer output 945, y(m), where m=2n and 2n+1 for this example timing ratio having an equal duty cycle, comprising the latched digital input data 930, $x_L(n)$, and the corresponding complementary codes 935, $x_C(n)$. FIG. 14C illustrates, in the continuous time-domain, the analog output 916, y(t), having negative or complementary values 1031 and positive values 1032.

Figure 15:
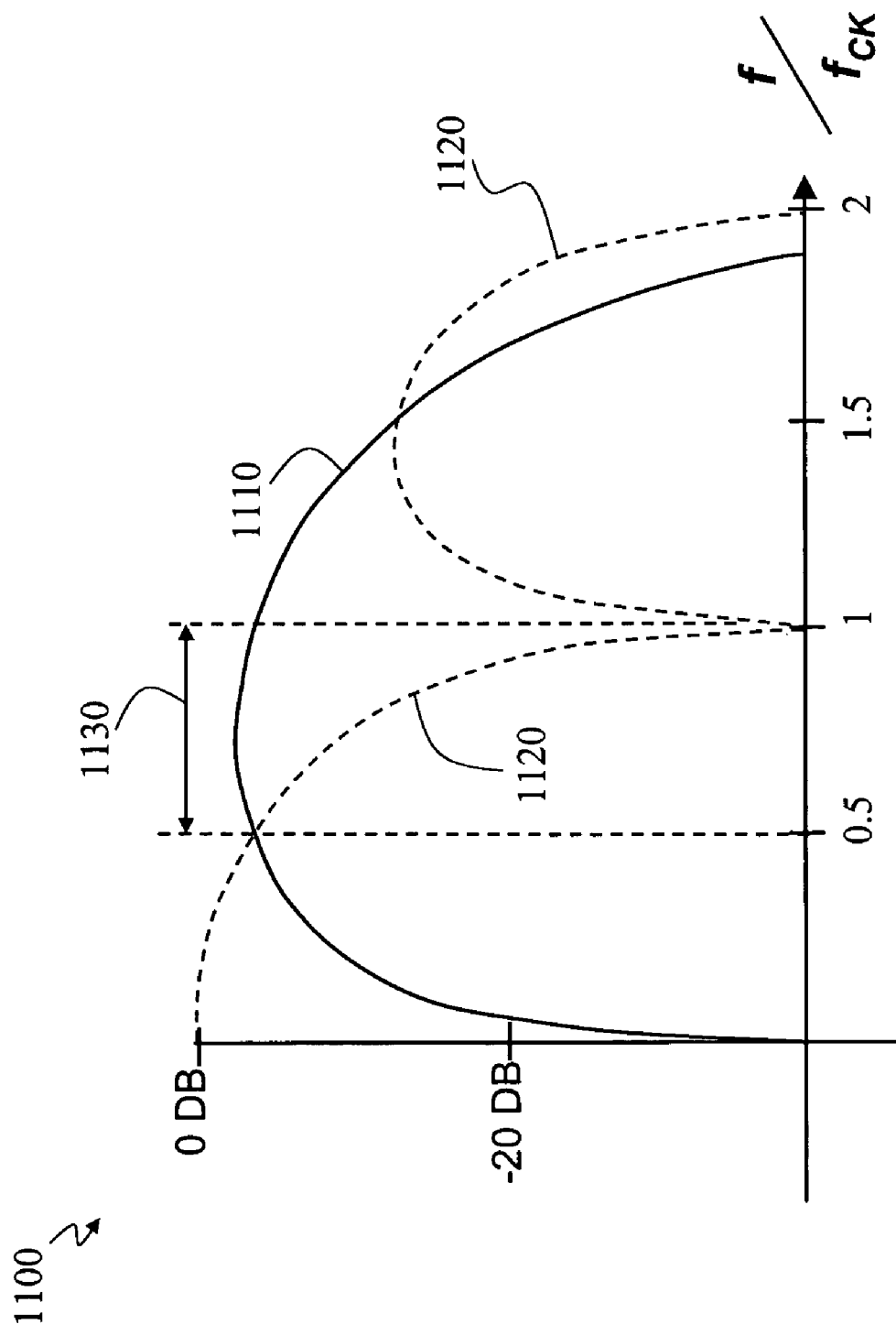
FIG. 15 illustrates a spectral envelope of an alternative embodiment of the present invention having a complementary interpolation process and a 1:1 timing ratio and spectral envelope of a conventional DAC.

The complementary interpolation method and apparatus selectively enhance the usable spectrum of the direct-digital-frequency synthesizer beyond the Nyquist frequency, that is, beyond half the sample frequency corresponding to half of the inverse of the system clock cycle. A pair of frequency responses is shown in FIG. 15 illustrating the spectral envelope of the present alternative invention 1100. The spectral envelope of the complementary interpolation digital-to-analog converter, 1110, is expressed as:

$$\frac{1}{2}\cdot\left|Sinc\left(\frac{\pi\cdot f}{2\cdot f_{CK}}\right)\right|\times|1-\exp(-j\pi f/f_{CK})|,\qquad [4]$$

where f is the frequency variable and $f_{ck}$ is the clock frequency of the digital-to-analog converter. Due to the complementary interpolation, the high-pass filtering process enhances the spectral power in a range of frequencies 1130 from a half clock, $\frac{1}{2}f_{ck}$ to one clock, $f_{ck}$. The spectrum around the clock frequency $f_{ck}$ is selectively enhanced as compared to the conventional digital-to-analog converter of which the frequency response 1120 reaches a minimum at the vicinity of a clock frequency multiple, $f_{ck}$.

Figure 16:
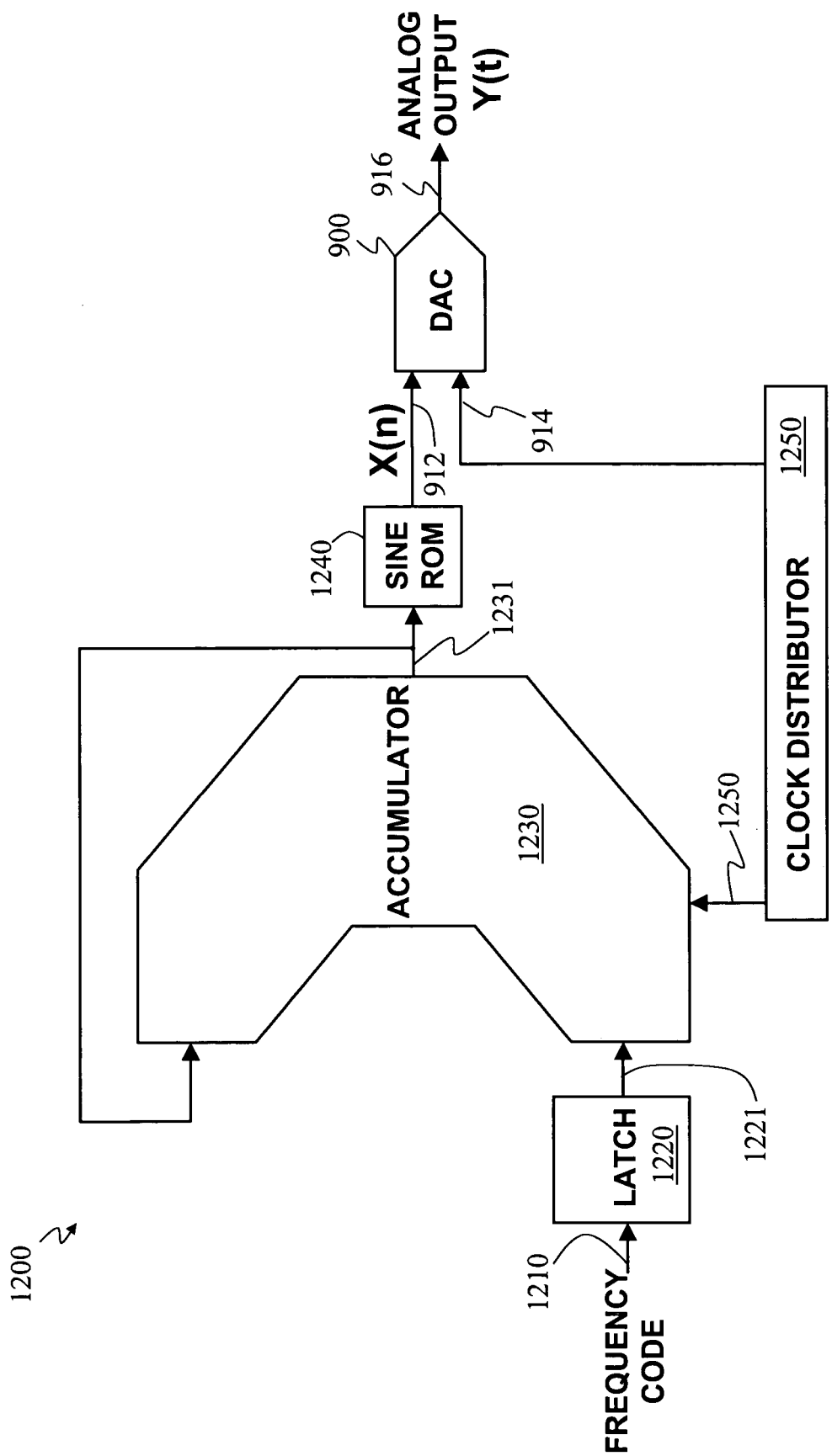
FIG. 16 shows a functional diagram of a direct-to-digital-frequency synthesizer with a complementary interpolation digital-to-analog converter of the alternative embodiment of the instant invention.

FIG. 16 shows a direct-digital-frequency synthesizer 1200 embodiment of the present invention including a frequency code input 1210 followed by a latch 1220, an accumulator 1230, a sine-wave ROM 1240, a clock distribution unit 1250, and a complimentary interpolation digital-to-analog converter 900 example embodiment of the present invention. The frequency code 1210 is latched by the latch unit 1220 and the output of the latched frequency code 1221 is accumulated in the accumulator 1230. A determination of the digital waveform for the digital input data 912, x(n), is next made. This is accomplished by example where the accumulated digital word 1231 is passed to the sine-wave ROM 1240 wherein an appropriate amplitude for the waveform is determined via a lookup. The determined digital waveform for the digital input data 912, x(n), is fed to a complementary interpolation digital-to-analog converter 900 as described by example as the alternative embodiment of the present invention.

Figure 17:
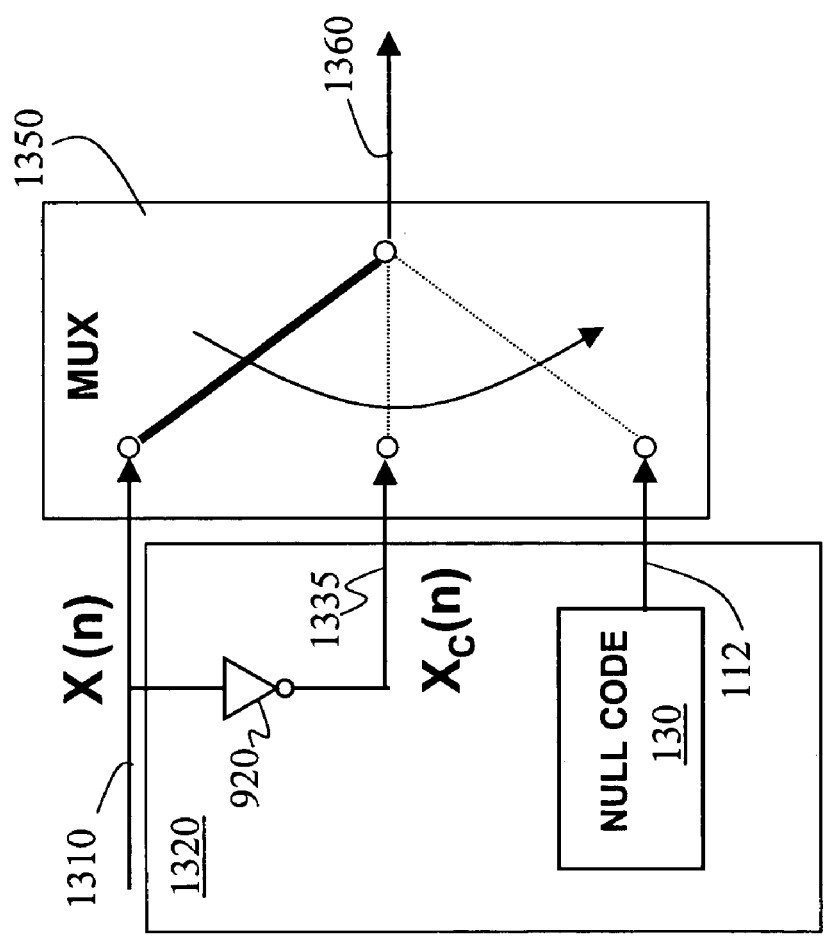
FIG. 17 shows a multiplexing element of the present invention generating a digital output by selecting input data, complementary code and null code.

In some embodiments, the internal expansion module includes both an inverter module and a null code generator or is replaced by a combination including an inverter module and a null code generator. Additionally, in some embodiments, the multiplexer selects, in a scheduled fashion within a clock cycle, from the digital input data, the null code and the complementary code. FIG. 17 shows a combination with a MUX 1350 generating a digital output 1360 by selecting the input data 1310, and from the internal expansion module or internal expansion code generator 1320 selecting the complementary code 1335 and the null code 112. According to the scheduled timing within a clock cycle, each of the input data 1310, the complementary code 1335 and the null code 112 can be selected by the MUX 1350 to achieve optimal performance of output signal power and usable spectral bandwidth.

Figure 18:
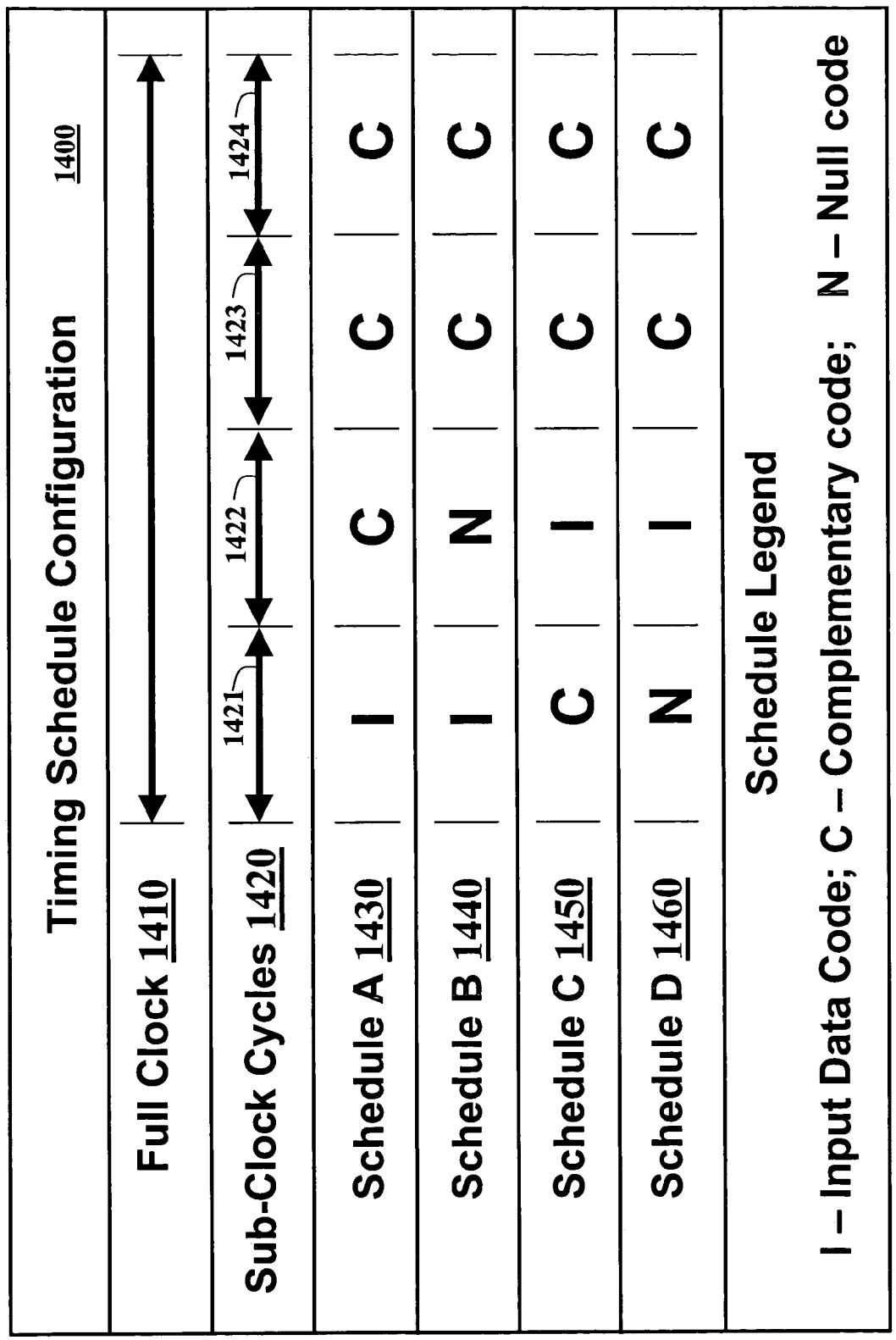
FIG. 18 illustrates four exemplary timing schedules of the present invention.
Figure 19:
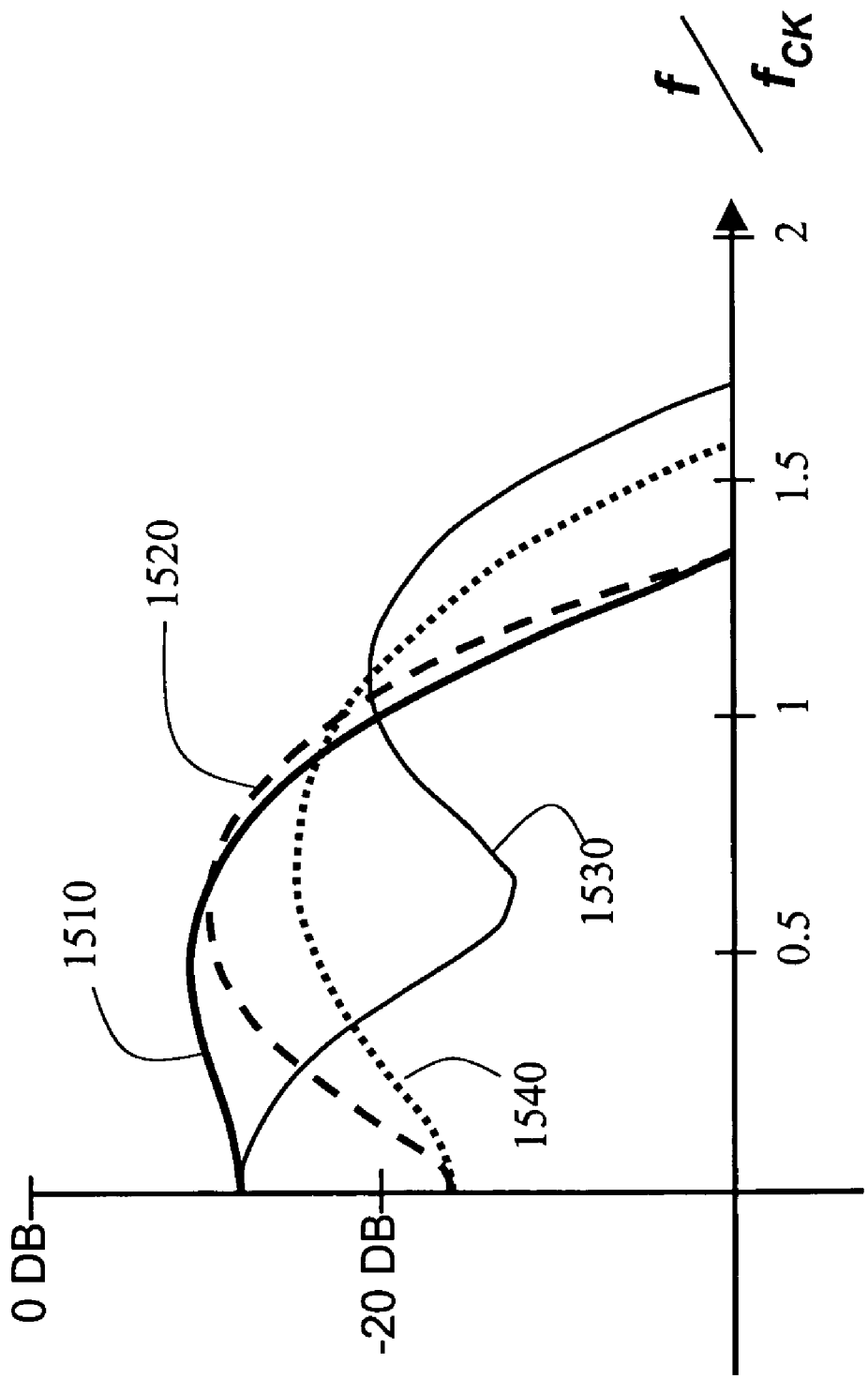
FIG. 19 illustrates the spectral envelopes of the four exemplary timing schedules of the present invention.

FIG. 18 shows, by way of example, four preferred configurations comprising four different timing schedules 1400. In this example schedule, there are four sub-clock cycles 1420 across a full clock cycle 1410 and each sub-clock cycle 1421–1414 is equal to one-fourth of a full clock cycle 1410. In Schedule A 1430, the MUX 1350 selects the input data code 1310 in the first sub-clock cycle 1421, and selects the complementary code 1335 in the rest of three sub-clock cycles 1422–1424. In Schedule B 1440, the MUX 1350 selects the input data code 1310 in the first sub-clock cycle 1421, selects the null code 112 in the second sub-clock cycle 1422 and selects the complementary code 1335 in the third and fourth sub-clock cycles 1423, 1424. In Schedule C 1450, the MUX 1350 selects the complementary code 1320 in the first sub-clock cycle 1421, selects the input data code 1310 in the second sub-clock cycle 1422 and selects the complementary code 1335 in the third and fourth sub-clock cycles 1423, 1424. In Schedule D 1460, the MUX 1350 selects the null code 112 in the first sub-clock cycle 1421, selects the input data code 1310 in the second sub-clock cycle 1422 and selects the complementary code 1335 in the third and fourth sub-clock cycles 1423, 1424. FIG. 19 shows the corresponding spectral envelopes 1510, 1520, 1530 and 1540 for the four exemplary timing schedules of FIG. 18, Schedule A 1430, Schedule B 1440, Schedule C 1450 and Schedule D 1460 respectively. Accordingly, different power levels and usable spectral bandwidths may be achieved by using different timing schedules by using the example MUX 1350 across a clock cycle having two or more sub-clock cycles.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result.

In addition to the equivalents of the claimed elements, obvious substitutions now or later known to one with ordinary skill in the art are defined to be within the scope of the defined elements.

The claims are thus to be understood to include what is specifically illustrated and described above, what is conceptually equivalent, what can be obviously substituted and also what essentially incorporates the essential idea of the invention.

We claim:

1. A direct-digital-frequency synthesizer adapted to receive a frequency code and adapted to output an analog current, the direct-digital-frequency synthesizer comprising:
    a first latch adapted to receive the frequency code;
    an accumulator adapted to receive the latched frequency code and a previously accumulated digital word and adapted to output a currently accumulated digital word, wherein the currently accumulated digital word upon output replaces the previously accumulated digital word for a next cycle;
    a waveform determiner adapted to receive the currently accumulated digital word and output a digital data input;
    a first clock signal distribution module adapted to transmit a first clock signal to the accumulator and a second clock signal to a digital-to-analog converter (DAC); and
    the digital-to-analog converter (DAC) adapted to receive the digital input data and the second clock signal and adapted to output an analog current, the DAC comprising:
        an expansion code generator adapted to output a first digital expansion code;
        a second latch adapted to receive the digital input data and hold the digital input data;
        a multiplexer adapted to generate output by selecting the first digital expansion code from the expansion code generator during a first fraction of a clock cycle, the clock cycle comprising a plurality of cycle fractions, and by selecting the digital input data held by the second latch in a second fraction of the clock cycle, wherein the clock cycle is driven by a multiplexer clock signal;
        a third latch adapted to receive the generated output of the multiplexer and adapted to hold the generated output of the multiplexer;
        a current switch array adapted to receive the held multiplexer output and adapted to output analog current, and
        a second clock distributor adapted to receive the second clock signal and adapted to provide a second latch module clock signal, a third latch module clock signal, and the multiplexer clock signal.

2. The direct-digital-frequency synthesizer as claimed in claim 1 comprising a segmentation module adapted to divide the digital input data into binary weighted codes and thermometer codes and wherein the segmentation module is adapted to output segmented code to the second latch module.

3. The direct-digital-frequency synthesizer as claimed in claim 1 wherein the first fraction of the multiplexer clock cycle is equal in duration with the second fraction.

4. The direct-digital-frequency synthesizer as claimed in claim 1 wherein the first fraction of the multiplexer clock cycle is greater in duration than the second fraction of the multiplexer clock cycle.

5. The direct-digital-frequency synthesizer as claimed in claim 1 wherein the first fraction of the multiplexer clock cycle is less in duration than the second fraction of the multiplexer clock cycle.

6. The direct-digital-frequency synthesizer as claimed in claim 1 wherein the waveform determiner comprises a sine wave table lookup.

7. The direct-digital-frequency synthesizer as claimed in claim 1 wherein the expansion code generator comprises a null code generator and wherein the first digital expansion code comprises a null code.

8. The direct-digital-frequency synthesizer as claimed in claim 1 wherein the expansion code generator comprises an inverter adapted to output the received digital input as complementary data and wherein the first digital expansion code comprises complementary data.

9. The direct-digital-frequency synthesizer as claimed in claim 1 wherein the multiplexer is further adapted to generate output by selecting, according to a schedule of fractions of the clock cycle, the first digital expansion code from the expansion code generator, a second digital expansion code from the expansion code generator and the digital input data held by the second latch, and wherein the expansion code generator comprises an inverter adapted to output the received digital input as complementary data and a null code generator adapted to output a digital null code and wherein the first digital expansion code comprises complementary data and wherein the second digital expansion code comprises null code.

10. A digital-to-analog converter (DAC) adapted to receive digital input data and adapted to output an analog signal, the DAC comprising:
an expansion code generator adapted to output a first digital expansion code;
a multiplexer adapted to generate output by selecting the first digital expansion code from the expansion code generator during a first fraction of a clock cycle, the clock cycle comprising a plurality of cycle fractions, and by selecting the digital input data in a second fraction of the clock cycle;
a first latch adapted to hold the generated output of the multiplexer; and
a current switch array adapted to receive the held multiplexer output and to output analog current.

11. The digital-to-analog converter of claim 10 further comprising a second latch adapted to receive the digital input data and hold the digital input data wherein the multiplexer is further adapted to select the digital input data held by the second latch in the second fraction of the clock cycle.

12. The digital-to-analog converter of claim 11 further comprising a clock distributor adapted to receive a clock signal and adapted to provide a first latch module clock signal, a second latch module clock signal, and a multiplexer clock signal.

13. The digital-to-analog converter of claim 11 further comprising a segmentation module adapted to divide the digital input data into binary weighted codes and thermometer codes and the segmentation module is adapted to output segnented code to the second latch module.

14. The digital-to-analog converter of claim 11 wherein the expansion code generator comprises an inverter adapted to output the received digital input as complementary data and wherein the first digital expansion code comprises complementary data.

15. The digital-to-analog converter of claim 11 wherein the multiplexer is further adapted to generate output by selecting, according to a schedule of fractions of the clock cycle, the first digital expansion code from the expansion code generator, a second digital expansion code from the expansion code generator and the digital input data held by the second latch, and
wherein the expansion code generator comprises an inverter adapted to output the received digital input as complementary data and a null code generator adapted to output a digital null code and wherein the first digital expansion code comprises complementary data and wherein the second digital expansion code comprises null code.

16. The digital-to-analog converter of claim 10 wherein the first fraction of the multiplexer clock cycle is equal in duration with the second fraction of the multiplexer clock cycle.

17. The digital-to-analog converter of claim 10 wherein the first fraction of the multiplexer clock cycle is greater in duration than the second fraction of the multiplexer clock cycle.

18. The digital-to-analog converter of claim 10 wherein the first fraction of the multiplexer clock cycle is less in duration than the second fraction of the multiplexer clock cycle.

19. The digital-to-analog converter of claim 10 wherein the expansion code generator comprises a null code generator and wherein the first digital expansion code comprises a null code.

20. A method of generating and interleaving expansion code with digital input data by a multiplexer within a digital-to-analog converter, the method comprising the steps of:
generating an expansion code adapted to be interleaved with digital input data;
selecting, during a first fraction of a multiplexer clock cycle, the clock cycle comprising a plurality of cycle fractions, the generated expansion code;
selecting, during a second portion of the multiplexer clock cycle, a digital input data;
applying the selected expansion code and the selected digital input data to an output series.

21. The method of claim 20 wherein the step of generating an expansion code further comprises:
latching the digital input data;
inverting the latched digital input data to complementary data; and
outputting the complementary data as expansion code; and
wherein the digital input data selected by the multiplexer is the latched digital input data.

22. The method of claim 20 wherein the expansion code is a null code.

23. The method of claim 20 wherein the first fraction of the multiplexer clock cycle is equal in duration with the second portion of the multiplexer clock cycle.

24. The method of claim 20 wherein the first fraction of the multiplexer clock cycle is greater in duration than the second fraction of the multiplexer clock cycle.

25. The method of claim 20 wherein the first fraction of the multiplexer clock cycle is less in duration than the second fraction of the multiplexer clock cycle.

26. A method of generating and interleaving expansion code with digital input data by a multiplexer within a digital-to-analog converter having a clock cycle comprising a plurality of cycle fractions, the method comprising the steps of:
generating a first expansion code adapted to be interleaved with the digital input data and a second expansion code;
generating the second expansion code adapted to be interleaved with the digital input data and the first expansion code;
selecting, according to a schedule of the clock cycle factions, the first expansion code, the second expansion code and the digital input data;
applying the selected first expansion code, the selected second expansion code and the selected digital input data to an output series.

27. The method of claim 26 wherein the step of generating a first expansion code further comprises:
latching the digital input data;
inverting the latched digital input data to complementary data; and
outputting the complementary data as expansion code; and
wherein the digital input data selected by the multiplexer is the latched digital input data.

28. The method of claim 26 wherein the step of generating a second expansion code further comprises generating a null code.

* * * * *